US011997899B2

United States Patent
Zheng et al.

(10) Patent No.: US 11,997,899 B2
(45) Date of Patent: May 28, 2024

(54) PIXEL CIRCUIT, PIXEL DRIVING METHOD, DISPLAY PANEL AND DISPLAY DEVICE

(71) Applicant: BOE Technology Group Co., Ltd., Beijing (CN)

(72) Inventors: Can Zheng, Beijing (CN); Lujiang Huangfu, Beijing (CN); Libin Liu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/785,662

(22) PCT Filed: Aug. 11, 2021

(86) PCT No.: PCT/CN2021/112069
§ 371 (c)(1),
(2) Date: Jun. 15, 2022

(87) PCT Pub. No.: WO2022/062747
PCT Pub. Date: Mar. 31, 2022

(65) Prior Publication Data
US 2023/0052846 A1    Feb. 16, 2023

(30) Foreign Application Priority Data
Sep. 28, 2020 (CN) .......................... 202011041915.9

(51) Int. Cl.
*G09G 3/3233* (2016.01)
*G09G 3/3266* (2016.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC ... G09G 3/3233; G09G 3/3266; G09G 3/3291
See application file for complete search history.

(56) References Cited

U.S. PATENT DOCUMENTS 10,909,920 B2 *  2/2021  Zhu ..................... G09G 3/3233
11,017,723 B2 *  5/2021  Lee ..................... G09G 3/3258
(Continued)

FOREIGN PATENT DOCUMENTS

CN    103077680 A    5/2013
CN    104008723 A    8/2014
(Continued)

OTHER PUBLICATIONS

CN 202011041915.9 first office action.
(Continued)

*Primary Examiner* — Sardis F Azongha
(74) *Attorney, Agent, or Firm* — IPro, PLLC (57) ABSTRACT

The present disclosure provides a pixel circuit, a pixel driving method, a display panel and a display device. The pixel circuit includes a light-emitting element, a driving circuitry, a first energy storage circuitry, a second energy storage circuitry, a data writing circuitry and a compensation circuitry. The data writing circuitry is configured to write a data voltage into a first end of the first energy storage circuitry under the control of a gate driving signal provided by a gate line. The compensation circuitry is configured to control a control end of the driving circuitry to be electrically coupled to a second end of the driving circuitry under the control of a compensation control signal. The driving circuitry is configured to generate a driving current for driving the light-emitting element under the control of a potential at its control end.

15 Claims, 3 Drawing Sheets

(51) Int. Cl.
*G09G 3/3291* (2016.01)
*H10K 59/121* (2023.01)
*H10K 59/131* (2023.01)
*H10K 59/12* (2023.01)

(52) U.S. Cl.
CPC ....... *G09G 3/3291* (2013.01); *H10K 59/1213* (2023.02); *H10K 59/1216* (2023.02); *G09G 2300/0852* (2013.01); *G09G 2310/0278* (2013.01); *G09G 2310/061* (2013.01); *G09G 2320/0233* (2013.01); *H10K 59/1201* (2023.02)

(56) References Cited

U.S. PATENT DOCUMENTS

| | | | |
|---|---|---|---|
| 11,158,250 B2 * | 10/2021 | Xiao | G09G 3/3233 |
| 11,295,662 B2 * | 4/2022 | Jeon | G09G 3/32 |
| 2009/0108763 A1 * | 4/2009 | Han | G09G 3/3233 |
| | | | 315/169.3 |
| 2014/0167009 A1 | 6/2014 | Lee et al. | |
| 2014/0192038 A1 | 7/2014 | Qin et al. | |
| 2015/0356916 A1 * | 12/2015 | Qian | G09G 3/3233 |
| | | | 345/78 |
| 2018/0012548 A1 | 1/2018 | Koh | |
| 2018/0158407 A1 * | 6/2018 | Chai | G09G 3/3233 |
| 2018/0190197 A1 | 7/2018 | Chang et al. | |
| 2019/0252413 A1 | 8/2019 | Xu et al. | |
| 2020/0083306 A1 | 3/2020 | Choi et al. | |
| 2020/0135089 A1 | 4/2020 | Ji et al. | |
| 2020/0135112 A1 | 4/2020 | Zhang | |
| 2020/0176550 A1 | 6/2020 | Youn et al. | |
| 2020/0342808 A1 | 10/2020 | Han et al. | |
| 2021/0020108 A1 | 1/2021 | Chen et al. | |
| 2021/0065624 A1 | 3/2021 | Li et al. | |
| 2021/0212207 A1 | 7/2021 | Xiong et al. | |
| 2021/0219423 A1 | 7/2021 | Xiong et al. | |
| 2021/0335990 A1 | 10/2021 | Chen et al. | |
| 2021/0358405 A1 | 11/2021 | Yang et al. | |
| 2021/0407390 A1 | 12/2021 | Li et al. | |
| 2022/0301487 A1 | 9/2022 | Wang et al. | |
| 2022/0310010 A1 | 9/2022 | Cheng et al. | |
| 2022/0376024 A1 | 11/2022 | Zheng et al. | |

FOREIGN PATENT DOCUMENTS

| | | |
|---|---|---|
| CN | 105612620 A | 5/2016 |
| CN | 107527894 A | 12/2017 |
| CN | 207337880 U | 5/2018 |
| CN | 108257549 A | 7/2018 |
| CN | 108470539 A | 8/2018 |
| CN | 109036273 A | 12/2018 |
| CN | 109192141 A | 1/2019 |
| CN | 109584799 A | 4/2019 |
| CN | 109686314 A | 4/2019 |
| CN | 110010072 A | 7/2019 |
| CN | 110189706 A | 8/2019 |
| CN | 110189708 A | 8/2019 |
| CN | 110223636 A | 9/2019 |
| CN | 110322842 A | 10/2019 |
| CN | 110429116 A | 11/2019 |
| CN | 110895915 A | 3/2020 |
| CN | 111128080 A | 5/2020 |
| CN | 111199704 A | 5/2020 |
| CN | 111511100 A | 8/2020 |
| CN | 111511109 A | 8/2020 |
| CN | 111564136 A | 8/2020 |
| CN | 111627387 A | 9/2020 |
| CN | 111653240 A | 9/2020 |
| CN | 111696486 A | 9/2020 |
| CN | 112053661 A | 12/2020 |
| EP | 3113226 B1 | 5/2019 |
| KR | 20190081228 A | 7/2019 |

OTHER PUBLICATIONS

CN 202011041915.9 second office action.
CN 202011041915.9 third office action.
CN 202011041915.9 Decision of Rejection.
PCT/CN2021/112069 international search report and written opinion.
PCT/CN2021/097380 international search report and written opinion.

\* cited by examiner

Fig. 5

PIXEL CIRCUIT, PIXEL DRIVING METHOD, DISPLAY PANEL AND DISPLAY DEVICE

CROSS-REFERENCE TO RELATED APPLICATIONS

This application is the U.S. national phase of PCT Application No. PCT/CN2021/112069 filed on Aug. 11, 2021, which claims a priority of the Chinese Patent Application No. 202011041915.9 filed on Sep. 28, 2020, which is incorporated herein by reference in its entirety.

TECHNICAL FIELD

The present disclosure relates to the field of display technology, in particular to a pixel circuit, a pixel driving method, a display panel and a display device.

BACKGROUND

In a conventional pixel circuit, a gate line is used to simultaneously control the writing of a data voltage and the compensation for a threshold voltage of a driving transistor. A pulse width of a gate driving signal provided by the gate line is fixed, so mura (brightness unevenness) occurs due to a short threshold voltage compensation time at a high frequency, and thereby it is impossible for a display panel to display an image at the high frequency.

SUMMARY

In one aspect, the present disclosure provides in some embodiments a pixel circuit, including a light-emitting element, a driving circuitry, a first energy storage circuitry, a second energy storage circuitry, a data writing circuitry, and a compensation circuitry. The data writing circuitry is electrically coupled to a gate line, a data line and a first end of the first energy storage circuitry, and configured to write a data voltage provided by the data line into the first end of the first energy storage circuitry under the control of a gate driving signal provided by the gate line; a second end of the first energy storage circuitry is electrically coupled to a control end of the driving circuitry, and the first energy storage circuitry is configured to store electric energy; a first end of the driving circuitry is electrically coupled to a first voltage end; the compensation circuitry is electrically coupled to a compensation control line, the control end of the driving circuitry and a second end of the driving circuitry, and configured to enable the control end of the driving circuitry to be electrically coupled to the second end of the driving circuitry under the control of a compensation control signal provided by the compensation control line; the second energy storage circuitry is electrically coupled to the control end of the driving circuitry and configured to store electric energy; and the driving circuitry is configured to generate a driving current for driving the light-emitting element under the control of a potential at its control end.

In a possible embodiment of the present disclosure, the compensation circuitry includes a compensation control transistor, a control electrode of the compensation control transistor is electrically coupled to the compensation control line, a first electrode of the compensation control transistor is electrically coupled to the control end of the driving circuitry, a second electrode of the compensation control transistor is electrically coupled to the second end of the driving circuitry, and the compensation control transistor is an oxide transistor.

In a possible embodiment of the present disclosure, the pixel circuit further includes a first resetting circuitry. The first resetting circuitry is electrically coupled to a resetting control line, a switching control line, the control end of the driving circuitry, the first end of the first energy storage circuitry, an initial voltage end and a reference voltage end, and configured to write an initial voltage provided by the initial voltage end into the control end of the driving circuitry under the control of a resetting control signal provided by the resetting control line and a switching control signal provided by the switching control line, and write a reference voltage provided by the reference voltage end into the first end of the first energy storage circuitry under the control of the resetting control signal.

In a possible embodiment of the present disclosure, the first resetting circuitry includes a first resetting transistor, a switching control transistor and a second resetting transistor. A control electrode of the switching control transistor is electrically coupled to the switching control line; a control electrode of the first resetting transistor is electrically coupled to the resetting control line, a first electrode of the first resetting transistor is electrically coupled to the initial voltage end, and a second electrode of the first resetting transistor is electrically coupled to a first electrode of the switching control transistor; a second electrode of the switching control transistor is electrically coupled to the control end of the driving circuitry; a control electrode of the second resetting transistor is electrically coupled to the resetting control line, a first electrode of the second resetting transistor is electrically coupled to the reference voltage end, and a second electrode of the second resetting transistor is electrically coupled to the first end of the first energy storage circuitry; and the first resetting transistor and the second resetting transistor are both oxide transistors.

In a possible embodiment of the present disclosure, the pixel circuit further includes a light-emission control circuitry; a control end of the light-emission control circuitry is electrically coupled to a light-emission control line, a first end of the light-emission control circuitry is electrically coupled to the second end of the driving circuitry, and a second end of the light-emission control circuitry is electrically coupled to a first electrode of the light-emitting element; the light-emission control circuitry is configured to enable the second end of the driving circuitry to be electrically coupled to the first electrode of the light-emitting element under the control of a light-emission control signal provided by the light-emission control line; and a second electrode of the light-emitting element is electrically coupled to a second voltage end.

In a possible embodiment of the present disclosure, the pixel circuit further includes a second resetting circuitry; a control end of the second resetting circuitry is electrically coupled to the gate line, a first end of the second resetting circuitry is electrically coupled to the initial voltage end, a second end of the second resetting circuitry is electrically coupled to the first electrode of the light-emitting element, and the second resetting circuitry is configured to write the initial voltage provided by the initial voltage end into the first electrode of the light-emitting element under the control of the gate driving signal.

In a possible embodiment of the present disclosure, the light-emission control circuitry includes a light-emission control transistor, and the second resetting circuitry includes a third resetting transistor; a control electrode of the light-emission control transistor is electrically coupled to the light-emission control line, a first electrode of the light-emission control transistor is electrically coupled to the second end of the driving circuitry, and a second electrode of the light-emission control transistor is electrically coupled to the first electrode of the light-emitting element; and a control electrode of the third resetting transistor is electrically coupled to the gate line, a first electrode of the third resetting transistor is electrically coupled to the initial voltage end, and a second electrode of the third resetting transistor is electrically coupled to the first electrode of the light-emitting element.

In a possible embodiment of the present disclosure, the light-emission control transistor and the third resetting transistor are low temperature polysilicon transistors.

In a possible embodiment of the present disclosure, the data writing circuitry includes a data writing transistor, the driving circuitry includes a driving transistor, the first energy storage circuitry includes a first storage capacitor, and the second energy storage circuitry includes a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; the second end of the first storage capacitor is electrically coupled to the control electrode of the driving transistor; and a first end of the second storage capacitor is electrically coupled to the control electrode of the driving transistor, and a second end of the second storage capacitor is electrically coupled to the first voltage end.

In a possible embodiment of the present disclosure, the data writing transistor and the driving transistor are both low temperature polysilicon transistors.

In another aspect, the present disclosure provides in some embodiments a method for driving the above-mentioned pixel circuit, including: writing, by the data writing circuitry, a data voltage into the first end of the first energy storage circuitry under the control of a gate driving signal; enabling, by the compensation circuitry, the control end of the driving circuitry to be electrically coupled to the second end of the driving circuitry under the control of a compensation control signal; and generating, by the driving circuitry, a driving current for driving the light-emitting element under the control of a potential at the control end of the driving circuitry.

In a possible embodiment of the present disclosure, the compensation control signal is a pulse signal, and a pulse width of the compensation control signal is adjustable.

In yet another aspect, the present disclosure provides in some embodiments a display panel including the above-mentioned pixel circuit.

In still yet another aspect, the present disclosure provides in some embodiments a display device including the above-mentioned display panel.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be triodes, thin film transistors (TFT), field effect transistors (FETs) or any other elements having an identical characteristic. In order to differentiate two electrodes other than a control electrode from each other, one of the two electrodes is called as first electrode and the other is called as second electrode.

In actual use, when the transistor is a triode, the control electrode may be a base, the first electrode may be a collector and the second electrode may be an emitter, or the control electrode may be a base, the first electrode may be an emitter and the second electrode may be a collector.

In actual use, when the transistor is a TFT or FET, the control electrode may be a gate electrode, the first electrode may be a drain electrode and the second electrode may be a source electrode, or the control electrode may be a gate electrode, the first electrode may be a source electrode and the second electrode may be a drain electrode.

Figure 1:
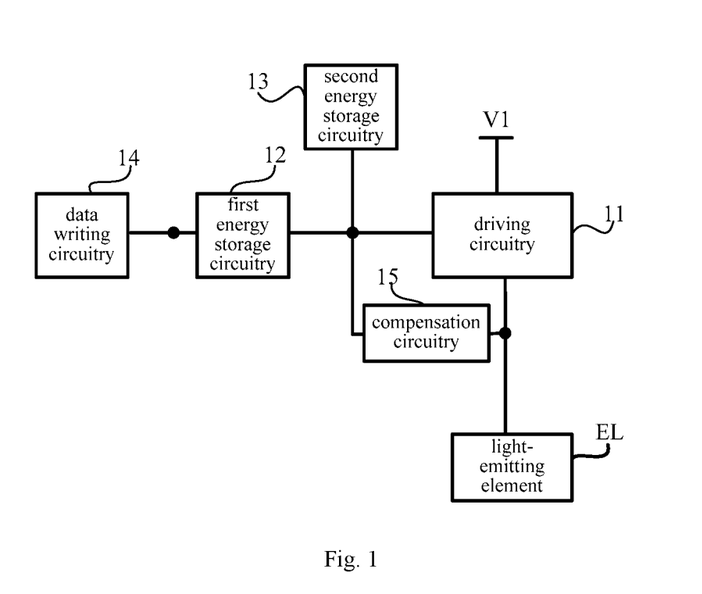
FIG. 1 is a schematic view showing a pixel circuit according to one embodiment of the present disclosure.

As shown in FIG. 1, the present disclosure provides in some embodiments a pixel circuit, which includes a light-emitting element EL, a driving circuitry 11, a first energy storage circuitry 12, a second energy storage circuitry 13, a data writing circuitry 14 and a compensation circuitry 15. The data writing circuitry 14 is electrically coupled to a gate line Sn, a data line and a first end of the first energy storage circuitry 12, and configured to write a data voltage Vdt provided by the data line into the first end of the first energy storage circuitry 12 under the control of a gate driving signal provided by the gate line Sn. A second end of the first energy storage circuitry 12 is electrically coupled to a control end of the driving circuitry 11, and the first energy storage circuitry 12 is configured to store electric energy. A first end of the driving circuitry 11 is electrically coupled to a first voltage end V1. The compensation circuitry 15 is electrically coupled to a compensation control line AZn, a control end of the driving circuitry 11 and a second end of the driving circuitry 11, and configured to enable the control end of the driving circuitry 11 to be electrically coupled to the second end of the driving circuitry 11 under the control of a compensation control signal provided by the compensation control line AZn. The second energy storage circuitry 13 is electrically coupled to the control end of the driving circuitry 11 and configured to store electric energy. The driving circuitry 11 is configured to generate a driving current for driving the light-emitting element EL under the control of a potential at its control end.

In at least one embodiment of the present disclosure, V1 may be, but not limited to, a high voltage end.

In FIG. 1, the second end of the driving circuitry 11 is electrically coupled to a first electrode of the light-emitting element EL, and a second electrode of the light-emitting element EL is electrically coupled to a second voltage end, but the present disclosure is not limited thereto. In at least one embodiment of the present disclosure, the second end of the driving circuitry 11 may be electrically coupled to the first electrode of the light-emitting element through a light-emission control circuitry, and the light-emission control circuitry is configured to control the second end of the driving circuitry 11 to be electrically coupled to, or electrically decoupled from, the first electrode of the light-emitting element under the control of a light-emission control signal.

During the operation, the writing of the data writing circuitry 14 is controlled through the gate line Sn (the gate line Sn may be any gate line), and the compensation circuitry 15 is controlled through the compensation control line AZn to compensate for a threshold voltage (the threshold voltage is a threshold voltage of a driving transistor in the driving circuitry). The compensation control signal provided by the compensation control line AZn is a square wave signal, and a pulse width of the compensation control signal is adjustable so as to adjust a threshold voltage compensation time, and prevent the occurrence of mura due to a short threshold voltage compensation time at a high frequency.

In at least one embodiment of the present disclosure, the first energy storage circuitry 12 is configured to store the data voltage Vdt written by the data writing circuitry into the control end of the driving circuitry, and the second energy storage circuitry 13 is configured to store the threshold voltage of the driving transistor in the driving circuitry 11. However, the present disclosure is not limited thereto.

In a possible embodiment of the present disclosure, the compensation circuitry includes a compensation control transistor. A control electrode of the compensation control transistor is electrically coupled to the compensation control line, a first electrode of the compensation control transistor is electrically coupled to the control end of the driving circuitry, and a second electrode of the compensation control transistor is electrically coupled to the second end of the driving circuitry. The compensation control transistor is an oxide transistor.

In at least one embodiment of the present disclosure, the compensation control transistor is an oxide transistor. The oxide transistor has a relatively small leakage current, so it is able to maintain the potential at the control end of the driving circuitry at a light-emission stage in a better manner.

Figure 2:
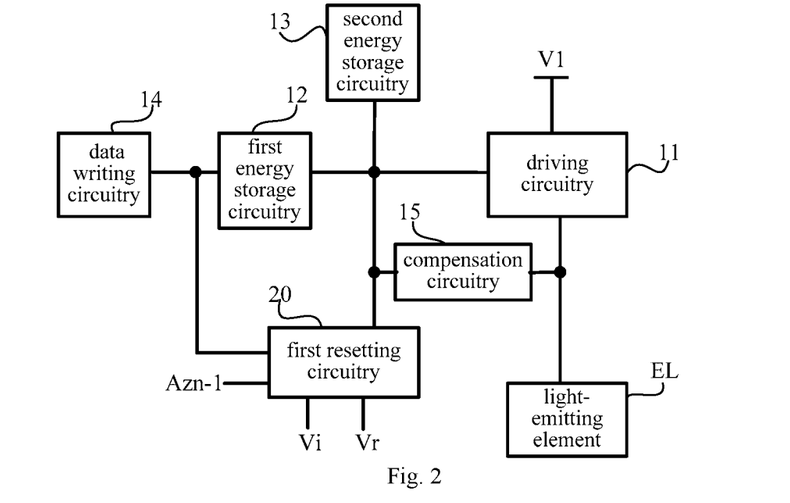
FIG. 2 is another schematic view showing the pixel circuit according to one embodiment of the present disclosure.

During the implementation, as shown in FIG. 2, on the basis of the pixel circuit in FIG. 1, the pixel circuit further includes a first resetting circuitry 20. The first resetting circuitry 20 is electrically coupled to a resetting control line AZn-1, a switching control line Sc, the control end of the driving circuitry 11, the first end of the first energy storage circuitry 12, an initial voltage end and a reference voltage end, and configured to write an initial voltage Vi provided by the initial voltage end into the control end of the driving circuitry 11 and write a reference voltage Vr provided by the reference voltage end into the first end of the first energy storage circuitry 12 under the control of a resetting control signal provided by the resetting control line AZn-1 and a switching control signal provided by the switching control line Sc.

During the operation of the pixel circuit in FIG. 2, at a resetting stage, the first resetting circuitry 20 writes Vi into the control end of the driving circuitry 11 under the control of the resetting control signal and the switching control signal, so as to turn on the driving transistor of the driving circuitry 11 at the beginning of a compensation stage.

At the resetting stage, the first resetting circuitry 20 writes Vr into the first end of the first energy storage circuitry 12 under the control of the resetting control signal, so as to accurately write the data voltage Vdt.

During the implementation, when the driving transistor is a p-type transistor, the initial voltage Vi may be a low voltage.

In a possible embodiment of the present disclosure, the reference voltage may be selected in accordance with a range of the data voltage.

In at least one embodiment of the present disclosure, the compensation control signal provided by the compensation control line AZn and the resetting control signal provided by the resetting control line AZn-1 may come from a same shift register, and the resetting control line AZn-1 may be a previous compensation control line adjacent to AZn. However, the present disclosure is not limited thereto.

In a possible embodiment of the present disclosure, the first resetting circuitry includes a first resetting transistor, a switching control transistor and a second resetting transistor. A control electrode of the switching control transistor is electrically coupled to the switching control line. A control electrode of the first resetting transistor is electrically coupled to the resetting control line, a first electrode of the first resetting transistor is electrically coupled to the initial voltage end, and a second electrode of the first resetting transistor is electrically coupled to a first electrode of the switching control transistor. A second electrode of the switching control transistor is electrically coupled to the control end of the driving circuitry. A control electrode of the second resetting transistor is electrically coupled to the resetting control line, a first electrode of the second resetting transistor is electrically coupled to the reference voltage end, and a second electrode of the second resetting transistor is electrically coupled to the first end of the first energy storage circuitry. The first resetting transistor and the second resetting transistor are both oxide transistors.

In at least one embodiment of the present disclosure, the switching control transistor is adopted so as to prevent the initial voltage from being written into the control end of the driving circuitry at the compensation stage.

In a possible embodiment of the present disclosure, when the light-emission control line is an $n^{th}$ light-emission control line (n is a positive integer), the switching control line is an $(n+1)^{th}$ light-emission control line, so as to reduce the quantity of control lines. At this time, a type of the first resetting transistor is different from a type of the switching control transistor. For example, the first resetting transistor is, but not limited to, an n-type transistor, and the switching transistor is, but not limited to, a p-type transistor.

In at least one embodiment of the present disclosure, the first resetting transistor and the second resetting transistor are both oxide transistors. The oxide transistor has a relatively small leakage current, so it is able to maintain the potential at the control end of the driving circuitry at the light-emission stage in a better manner.

In at least one embodiment of the present disclosure, T8 is, but not limited to, a low temperature polysilicon transistor. T8 is turned on at a majority of the light-emission stage, so it is unnecessary to reduce the leakage current of T8 at this time, i.e., it is unnecessary to design T8 as the oxide transistor.

In at least one embodiment of the present disclosure, the pixel circuit further includes a light-emission control circuitry. A control end of the light-emission control circuitry is electrically coupled to a light-emission control line, a first end of the light-emission control circuitry is electrically coupled to the second end of the driving circuitry, and a second end of the light-emission control circuitry is electrically coupled to a first electrode of the light-emitting element. The light-emission control circuitry is configured to enable the second end of the driving circuitry to be electrically coupled to the first electrode of the light-emitting element under the control of a light-emission control signal provided by the light-emission control line. A second electrode of the light-emitting element is electrically coupled to a second voltage end.

In a possible embodiment of the present disclosure, the second voltage end is a grounded end or a low voltage end.

During the implementation, the pixel circuit further includes a second resetting circuitry. A control end of the second resetting circuitry is electrically coupled to the gate line, a first end of the second resetting circuitry is electrically coupled to the initial voltage end, and a second end of the second resetting circuitry is electrically coupled to the first electrode of the light-emitting element. The second resetting circuitry is configured to write the initial voltage provided by the initial voltage end into the first electrode of the light-emitting element under the control of the gate driving signal, so as to remove residual charges in the light-emitting element.

Figure 3:
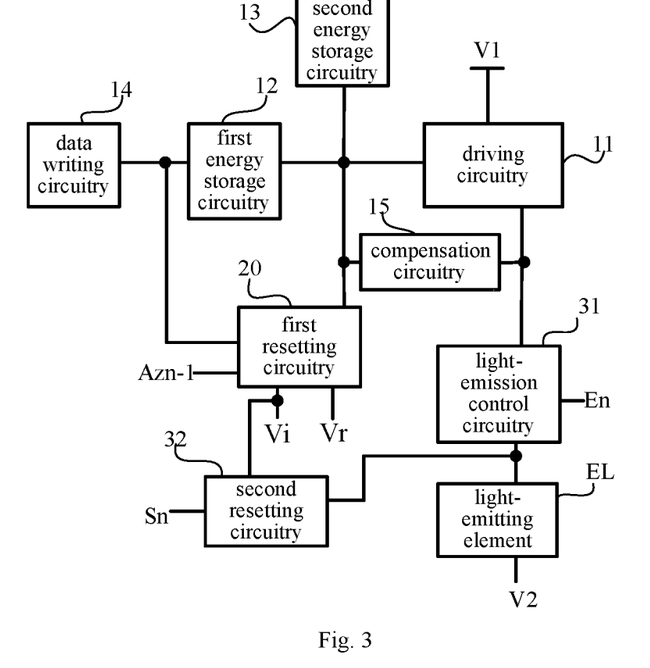
FIG. 3 is yet another schematic view showing the pixel circuit according to one embodiment of the present disclosure.

As shown in FIG. 3, on the basis of the pixel circuit in FIG. 2, the pixel circuit further includes a light-emission control circuitry 31 and a second resetting circuitry 32. A control end of the light-emission control circuitry 31 is electrically coupled to a light-emission control line En, a first end of the light-emission control circuitry 31 is electrically coupled to the second end of the driving circuitry 11, and a second end of the light-emission control circuitry 31 is electrically coupled to the first electrode of the light-emitting element EL. The light-emission control circuitry 31 is configured to enable the second end of the driving circuitry 11 to be electrically coupled to the first electrode of the light-emitting element EL under the control of a light-emission control signal provided by the light-emission control line En. A second electrode of the light-emitting element EL is electrically coupled to a second voltage end V2. A control end of the second resetting circuitry 32 is electrically coupled to the gate line Sn, a first end of the second resetting circuitry 32 is electrically coupled to the initial voltage end, and a second end of the second resetting circuitry 32 is electrically coupled to the first electrode of the light-emitting element EL. The second resetting circuitry 32 is configured to write the initial voltage Vi provided by the initial voltage end into the first electrode of the light-emitting element EL under the control of the gate driving signal provided by Sn, so as to remove the residual charges in the light-emitting element EL.

During the operation of the pixel circuit in FIG. 3, the light-emission control circuitry 31 controls the driving circuitry 11 to be electrically coupled to, or electrically decoupled from, the light-emitting element EL under the control of the light-emission control signal, and the second resetting circuitry 32 writes the initial voltage Vi into the first electrode of the light-emitting element EL under the control of the gate driving signal, so as to remove the residual charges in the light-emitting element EL.

During the operation of the pixel circuit in FIG. 3, a display period includes the resetting stage, the compensation stage, a data writing stage, and the light-emission stage.

At the resetting stage, the first resetting circuitry controls the control end of the driving circuitry to be electrically coupled to the first resetting circuitry under the control of the switching control signal, writes the initial voltage Vi into the control end of the driving circuitry under the control of the resetting control signal, and t writes the reference voltage Vr into the first end of the first energy storage circuitry under the control of the resetting control signal.

At the compensation phase, the first resetting circuitry controls the control end of the driving circuitry to be electrically decoupled from the first resetting circuitry under the control of the switching control signal, and writes the reference voltage Vr into the first end of the first energy storage circuitry under the control of the resetting control signal. The compensation control circuitry controls the control end of the driving circuitry to be electrically coupled to the second end of the driving circuitry under the control of the compensation control signal. At the beginning of the compensation phase, the driving circuitry controls the first end of the driving circuitry to be electrically coupled to the second end of the driving circuitry under the control of the potential at the control end. The second energy storage circuitry is charged by the first voltage signal provided by the first voltage end through the driving circuitry and the compensation circuitry, so as to pull up the potential at the control end of the driving circuitry until the potential becomes V01−|Vth_T3|, where V01 is a voltage value of the first voltage signal, and Vth_T3 is the threshold voltage of the driving transistor in the driving circuitry. A duration of the compensation phase (that is, the threshold voltage compensation time) is adjusted according to the practical need.

At the data writing stage, the data writing circuitry writes the data voltage provided by the data line into the first end of the first energy storage circuitry under the control of the gate driving signal so as to change the potential at the control end of the driving circuitry, and the second resetting circuitry writes the initial voltage Vi into the first electrode of the light-emitting element under the control of the gate driving signal.

At the light-emission stage, the light-emission control circuitry controls the second end of the driving circuitry to be electrically coupled to the first electrode of the light-emitting element under the control of the light-emission control signal, and the driving circuitry drives the light-emitting element to emit light.

At the compensation stage t2, En+1 provides a high voltage signal, En provides a high voltage signal, AZn-1 provides a high voltage signal, AZn provides a high voltage signal, and Sn provides a high voltage signal, so as to turn on T2, T4 and T5, and turn off T8, T4 and T1. At the beginning of the compensation phase t2, T3 is turned on, and C2 is charged by Vdd through the on-state T3 and T2, so as to pull up the potential at N1 until the potential becomes Vdd−|Vth_T3| and turn off T3, where Vth_T3 is the threshold voltage of T3. The pulse width of the compensation control signal provided by the AZn and the pulse width of the resetting control signal provided by the AZn-1 are adjustable, so the duration of the compensation stage t2 (i.e., the compensation time) may be adjusted in accordance with an actual mura level.

At the data writing stage t3, En+1 and En provide a high voltage signal, AZn-1 provides a low voltage signal, AZn provides a low voltage signal, Sn provides a low voltage signal, and the data line provides the data voltage Vdt, so as to turn on T1 and write Vdt into N2. At this time, the potential at N1 becomes Vdd−|Vth_T3|+(Vdt−Vr)C1z/(C1z+C2z), where C1z is a capacitance of C1, and C2z is a capacitance of C2. T8 is turned off, T7 is turned off, T2 is turned off, and T5 is turned off. T6 is turned on, so as to write Vi to an anode of O1 to remove the residual charges in the anode of O1.

At the light-emission stage t4, En provides a low voltage signal, AZn-1 provides a low voltage signal, AZn provides a low voltage signal, and Sn provides a high voltage signal, so as to turn off T6 and T1, turn off T4, T5 and T6, and turn off T2, thereby to maintain the potential at N1 as the potential at t3. T7 is turned on, and T3 drives O1 to emit light. A driving current I of T3 for driving O3 is equal to $K[(Vdt-Vr)C1z/(C1z+C2z)]^2$, where K is a current coefficient of T3. Based on the above, I is independent of the threshold voltage of T3.

In a possible embodiment of the present disclosure, the light-emission control circuitry includes a light-emission control transistor, and the second resetting circuitry includes a third resetting transistor. A control electrode of the light-emission control transistor is electrically coupled to the light-emission control line, a first electrode of the light-emission control transistor is electrically coupled to the second end of the driving circuitry, and a second electrode of the light-emission control transistor is electrically coupled to the first electrode of the light-emitting element. A control electrode of the third resetting transistor is electrically coupled to the gate line, a first electrode of the third resetting transistor is electrically coupled to the initial voltage end, and a second electrode of the third resetting transistor is electrically coupled to the first electrode of the light-emitting element.

In at least one embodiment of the present disclosure, the light-emission control transistor and the third resetting transistor are low temperature polysilicon transistors.

In a possible embodiment of the present disclosure, the data writing circuitry includes a data writing transistor, the driving circuitry includes a driving transistor, the first energy storage circuitry includes a first storage capacitor, and the second energy storage circuitry includes a second storage capacitor. A control electrode of the data writing transistor is electrically coupled to the gate line, a first electrode of the data writing transistor is electrically coupled to the data line, and a second electrode of the data writing transistor is electrically coupled to a first end of the first storage capacitor. A control electrode of the driving transistor is electrically coupled to a second end of the first storage capacitor, a first electrode of the driving transistor is electrically coupled to the first voltage end, and a second electrode of the driving transistor is the second end of the driving circuitry. The second end of the first storage capacitor is electrically coupled to the control electrode of the driving transistor. A first end of the second storage capacitor is electrically coupled to the control electrode of the driving transistor, and a second end of the second storage capacitor is electrically coupled to the first voltage end.

In at least one embodiment of the present disclosure, both the data writing transistor and the driving transistor are low temperature polysilicon transistors.

In at least one embodiment of the present disclosure, the light-emitting element is, but not limited to, an organic light-emitting diode.

Figure 4:
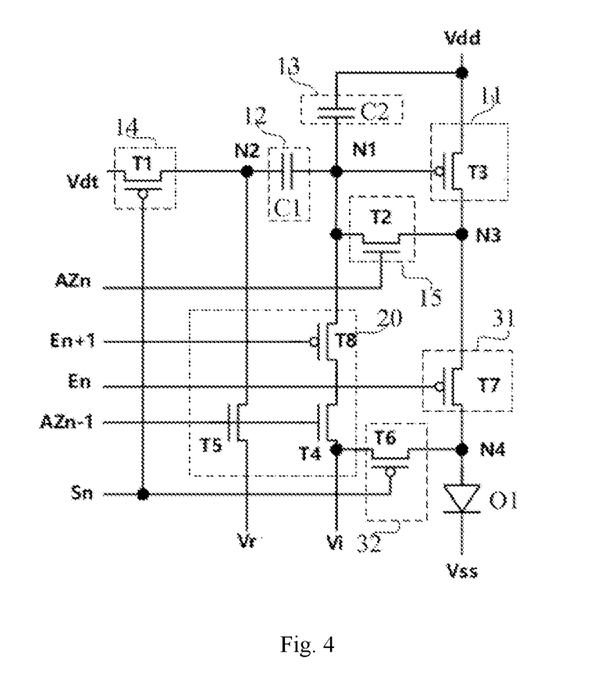
FIG. 4 is a circuit diagram of the pixel circuit according to one embodiment of the present disclosure.

As shown in FIG. 4, on the basis of the pixel circuit in FIG. 3, the light-emitting element is an organic light-emitting diode O1, and the switching control line is an $(n+1)^{th}$ light-emission control line En+1. The first resetting circuitry 20 includes a first resetting transistor T4, a switching control transistor T8 and a second resetting transistor T5, the driving circuitry 11 includes a driving transistor T3, the first energy storage circuitry 12 includes a first storage capacitor C1, and the compensation circuitry 15 includes a compensation control transistor T2.

A gate electrode of T2 is electrically coupled to the compensation control line AZn, a source electrode of T2 is electrically coupled to a gate electrode of the driving transistor T3, and a drain electrode of T2 is electrically coupled to a drain electrode of T3. A gate electrode of the switching control transistor T8 is electrically coupled to En+1. A gate electrode of the first resetting transistor T4 is electrically coupled to the resetting control line AZn-1, a drain electrode of the first resetting transistor T4 is electrically coupled to the initial voltage end, and a source electrode of the first resetting transistor T4 is electrically coupled to a source electrode of the switching control transistor T8. A drain electrode of the switching control transistor T8 is electrically coupled to the gate electrode of the driving transistor T3. The initial voltage end is configured to provide the initial voltage Vi. A gate electrode of the second resetting transistor 15 is electrically coupled to the resetting control line AZn-1, a drain electrode of the second resetting transistor T5 is electrically coupled to the reference voltage end, and a source electrode of the second resetting transistor T5 is electrically coupled to a first end of the first storage capacitor. The reference voltage end is configured to provide the reference voltage Vr.

The light-emission control circuitry 31 includes a light-emission control transistor T7, and the second resetting circuitry 32 includes a third resetting transistor T6.

A gate electrode of the light-emission control transistor T7 is electrically coupled to the light-emission control line En, a source electrode of the light-emission control transistor T7 is electrically coupled to the drain electrode of the driving transistor T3, and a drain electrode of the light-emission control transistor T7 is electrically coupled to an anode of the organic light emitting diode. A gate electrode of the third resetting transistor T6 is electrically coupled to the gate line Sn, a source electrode of the third resetting transistor T6 is electrically coupled to the initial voltage end, and a drain electrode of the third resetting transistor T6 is electrically coupled to the anode of O1. A cathode of O1 is electrically coupled to a low voltage end, and the low voltage end is configured to provide a low voltage Vss.

The data writing circuitry 14 includes a data writing transistor T1, the driving circuitry 11 includes a driving transistor, the second energy storage circuitry 13 includes a second storage capacitor C2.

A gate electrode of the data writing transistor T1 is electrically coupled to the gate line Sn, a source electrode of the data writing transistor T1 is electrically coupled to the data line, and a drain electrode of the data writing transistor T1 is electrically coupled to the first end of the first storage capacitor C1. The data line is configured to provide the data voltage Vdt.

A gate electrode of the driving transistor T3 is electrically coupled to a second end of the first storage capacitor C1, a source electrode of the driving transistor T3 is electrically coupled to a high voltage end, and the high voltage end is configured to provide a high voltage Vdd.

A second end of the first storage capacitor C1 is electrically coupled to the gate electrode of the driving transistor T3, a first end of the second storage capacitor C2 is electrically coupled to the gate electrode of the driving transistor T3, and a second end of the second storage capacitor C2 is electrically coupled to the high voltage end.

In the pixel circuit as shown in FIG. 4, N1 is a first node electrically coupled to the gate electrode of T3, N2 is a second node electrically coupled to the first end of C1, N3 is a third node electrically coupled to the drain electrode of T3, and N4 is a fourth node.

In the pixel circuit as shown in FIGS. 4, T3, T7, Ti, T8 and T6 are p-type transistors, and T2, T4 and T5 are n-type transistors.

T3, T7, T1, T8 and T6 are Low-Temperature Polycrystalline Silicon (LTPS) TFTs, so as to ensure the compensation of the threshold voltage, the writing of the data as well as the driving current for driving the light-emitting element to emit light, thereby to perform the writing of the data and the compensation of the threshold voltage at a high refresh rate.

T2, T4 and T5 are oxide TFTs, so as to prevent the occurrence of a current leakage at key nodes (the first node N1 and the third node N3), thereby to maintain the potential at the key node at a low frequency. In the embodiments of the present disclosure, the pixel circuit may be used to display an image at a refresh rate of 1 Hz to 120 Hz.

During the operation of the pixel circuit in FIG. 4, the pulse width of the compensation control signal provided by the AZn is adjustable. Through adjusting the pulse width of the compensation control signal, I tis able to adjust the threshold voltage compensation time, thereby to prevent the occurrence of mura due to a short threshold voltage compensation time at a high frequency.

Figure 5:
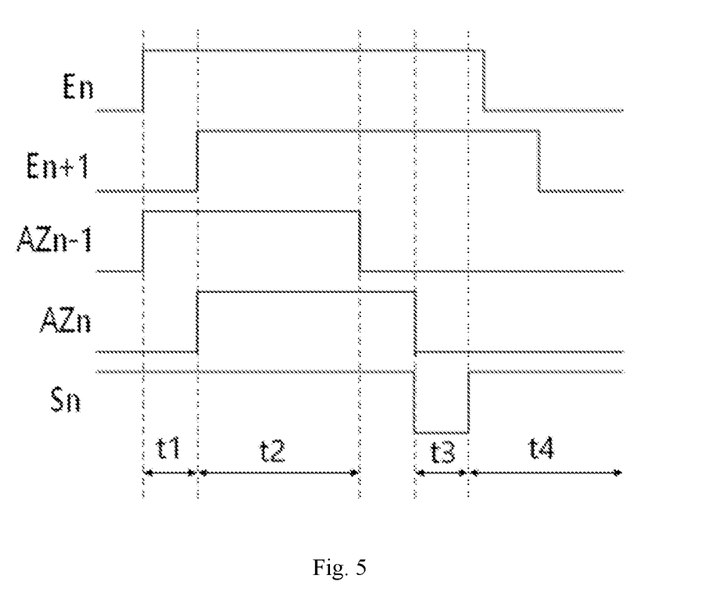
FIG. 5 is a sequence diagram of the pixel circuit in FIG. 4.

As shown in FIG. 5, during the operation of the pixel circuit in FIG. 4, a display period includes a resetting stage t1, a compensation stage t2, a data writing stage t3 and a light-emission stage t4 arranged in sequence.

At the resetting stage t1, En+1 provides a low voltage signal, AZn-1 provides a high voltage signal, and AZn provides a low voltage signal, so as to turn on T4, T5 and T8, thereby to write Vr into N2 and write Vi into N1. Sn provides a high voltage signal, and En provides a high voltage signal, so as to turn off T2, Ti, T6 and T7.

At the compensation stage t2, En+1 provides a high voltage signal, En provides a high voltage signal, AZn-1 provides a high voltage signal, AZn provides a high voltage signal, and Sn provides a high voltage signal, so as to turn on T2, T4 and T5, and turn off T8, T4 and Ti. At the beginning of the compensation stage t2, T3 is turned on, and C2 is charged by Vdd through the on-state T3 and T2, so as to pull up the potential at N1 until the potential becomes Vdd−|Vth_3|, and turn off T3, where Vth T3 is the threshold voltage of T3. The pulse width of the compensation control signal provided by the AZn and the pulse width of the resetting control signal provided by the AZn-1 are adjustable, so it is able to adjust the duration of the compensation phase t2 (the compensation time) in accordance with an actual mura level. s At the data writing stage t3, En+1 and En provide a high voltage signal, AZn-1 provides a low voltage signal, AZn provides a low voltage signal, Sn provides a low voltage signal, and the data line provides a data voltage Vdt, so as to turn on T1 and write Vdt into N2. At this time, the potential at N1 becomes Vdd−|Vth_T3|+(Vdt−Vr)C1z/(C1z+C2z), where C1z is a capacitance of C1, and C2z is a capacitance of C2. T8 is turned off, T7 is turned off, T2 is turned off, and T5 is turned off. T6 is turned on, so as to write Vi to an anode of O1 to remove the residual charges in the anode of O1.

At the light-emission stage t4, En provides a low voltage signal, AZn-1 provides a low voltage signal, AZn provides a low voltage signal, and Sn provides a high voltage signal, so as to turn off T6 and T1, turn off T4, T5 and T6, and turn off T2, thereby to maintain the potential at N1 as the potential at t3. T7 is turned on, and T3 drives O1 to emit light. A driving current I of T3 for driving O3 is equal to $K[(Vdt-Vr)C1z/(C1z+C2z)]^2$, where K is a current coefficient of T3. Based on the above, I is independent of the threshold voltage of T3.

The present disclosure further provides in some embodiments a method for driving the above-mentioned pixel circuit, which includes: writing, by the data writing circuitry, a data voltage into the first end of the first energy storage circuitry under the control of a gate driving signal; enabling, by the compensation circuitry, the control end of the driving circuitry to be electrically coupled to the second end of the driving circuitry under the control of a compensation control signal; and generating, by the driving circuitry, a driving current for driving the light-emitting element under the control of a potential at the control end of the driving circuitry.

In at least one embodiment of the present disclosure, the compensation control signal may be a pulsed signal, and a pulse width of the compensation control signal is adjustable. As a result, it is able to adjust a threshold voltage compensation time, thereby to prevent the occurrence of mura (brightness unevenness) due to a short threshold voltage compensation time at a high frequency.

The present disclosure further provides in some embodiments a display panel including the above-mentioned pixel circuit.

The present disclosure further provides in some embodiments a display device including the above-mentioned display panel.

The display device also includes the above-mentioned pixel circuit.

The display device may be any product or member having a display function, such as mobile phone, tablet computer, television, display, notebook computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A pixel circuit, comprising a light-emitting element, a driving circuitry, a first energy storage circuitry, a second energy storage circuitry, a data writing circuitry, and a compensation circuitry, wherein the data writing circuitry is electrically coupled to a gate line, a data line and a first end of the first energy storage circuitry, and configured to write a data voltage provided by the data line into the first end of the first energy storage circuitry under the control of a gate driving signal provided by the gate line;

a second end of the first energy storage circuitry is electrically coupled to a control end of the driving circuitry, and the first energy storage circuitry is configured to store electric energy;

a first end of the driving circuitry is electrically coupled to a first voltage end; the compensation circuitry is electrically coupled to a compensation control line, the control end of the driving circuitry and a second end of the driving circuitry, and configured to enable the control end of the driving circuitry to be electrically coupled to the second end of the driving circuitry under the control of a compensation control signal provided by the compensation control line;

the second energy storage circuitry is directly electrically coupled to the control end of the driving circuitry and configured to store electric energy; and the driving circuitry is configured to generate a driving current for driving the light-emitting element under the control of a potential at its control end;

wherein the pixel circuit further comprises a first resetting circuitry, the first resetting circuitry is electrically coupled to a resetting control line, a switching control line, the control end of the driving circuitry, the first end of the first energy storage circuitry, an initial voltage end and a reference voltage end, and configured to write an initial voltage provided by the initial voltage end into the control end of the driving circuitry under the control of a resetting control signal provided by the resetting control line and a switching control signal provided by the switching control line, and write a reference voltage provided by the reference voltage end into the first end of the first energy storage circuitry under the control of the resetting control signal; and wherein the first resetting circuitry comprises a first resetting transistor, a switching control transistor and a second resetting transistor, wherein a control electrode of the switching control transistor is electrically coupled to the switching control line; a control electrode of the first resetting transistor is electrically coupled to the resetting control line, a first electrode of the first resetting transistor is electrically coupled to the initial voltage end, and a second electrode of the first resetting transistor is electrically coupled to a first electrode of the switching control transistor; a second electrode of the switching control transistor is electrically coupled to the control end of the driving circuitry; a control electrode of the second resetting transistor is electrically coupled to the resetting control line, a first electrode of the second resetting transistor is electrically coupled to the reference voltage end, and a second electrode of the second resetting transistor is electrically coupled to the first end of the first energy storage circuitry; and the first resetting transistor and the second resetting transistor are both oxide transistors;

wherein the compensation control signal provided by the compensation control line and the resetting control signal provided by the resetting control line come from a same shift register, and the resetting control line is a previous compensation control line adjacent to the compensation control line; and wherein the compensation control signal is a pulse signal, and a pulse width of the compensation control signal is adjustable.

2. The pixel circuit according to claim 1, wherein the compensation circuitry comprises a compensation control transistor, a control electrode of the compensation control transistor is electrically coupled to the compensation control line, a first electrode of the compensation control transistor is electrically coupled to the control end of the driving circuitry, a second electrode of the compensation control transistor is electrically coupled to the second end of the driving circuitry, and the compensation control transistor is an oxide transistor.

3. The pixel circuit according to claim 2, wherein the data writing circuitry comprises a data writing transistor, the driving circuitry comprises a driving transistor, the first energy storage circuitry comprises a first storage capacitor, and the second energy storage circuitry comprises a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; and a first end of the second storage capacitor is electrically coupled to the control electrode of the driving transistor, and a second end of the second storage capacitor is electrically coupled to the first voltage end.

4. The pixel circuit according to claim 1, further comprising a light-emission control circuitry, wherein a control end of the light-emission control circuitry is electrically coupled to a light-emission control line, a first end of the light-emission control circuitry is electrically coupled to the second end of the driving circuitry, and a second end of the light-emission control circuitry is electrically coupled to a first electrode of the light-emitting element; the light-emission control circuitry is configured to enable the second end of the driving circuitry to be electrically coupled to the first electrode of the light-emitting element under the control of a light-emission control signal provided by the light-emission control line; and a second electrode of the light-emitting element is electrically coupled to a second voltage end.

5. The pixel circuit according to claim 4, further comprising a second resetting circuitry, wherein a control end of the second resetting circuitry is electrically coupled to the gate line, a first end of the second resetting circuitry is electrically coupled to the initial voltage end, a second end of the second resetting circuitry is electrically coupled to the first electrode of the light-emitting element, and the second resetting circuitry is configured to write the initial voltage provided by the initial voltage end into the first electrode of the light-emitting element under the control of the gate driving signal.

6. The pixel circuit according to claim 5, wherein the light-emission control circuitry comprises a light-emission control transistor, and the second resetting circuitry comprises a third resetting transistor; a control electrode of the light-emission control transistor is electrically coupled to the light-emission control line, a first electrode of the light-emission control transistor is electrically coupled to the second end of the driving circuitry, and a second electrode of the light-emission control transistor is electrically coupled to the first electrode of the light-emitting element; and a control electrode of the third resetting transistor is electrically coupled to the gate line, a first electrode of the third resetting transistor is electrically coupled to the initial voltage end, and a second electrode of the third resetting transistor is electrically coupled to the first electrode of the light-emitting element.

7. The pixel circuit according to claim 6, wherein the light-emission control transistor and the third resetting transistor are low temperature polysilicon transistors.

8. The pixel circuit according to claim 4, wherein the data writing circuitry comprises a data writing transistor, the driving circuitry comprises a driving transistor, the first energy storage circuitry comprises a first storage capacitor, and the second energy storage circuitry comprises a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; and a first end of the second storage capacitor is electrically coupled to the control electrode of the driving transistor, and a second end of the second storage capacitor is electrically coupled to the first voltage end.

9. The pixel circuit according to claim 5, wherein the data writing circuitry comprises a data writing transistor, the driving circuitry comprises a driving transistor, the first energy storage circuitry comprises a first storage capacitor, and the second energy storage circuitry comprises a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; and a first end of the second storage capacitor is electrically coupled to the control electrode of the driving transistor, and a second end of the second storage capacitor is electrically coupled to the first voltage end.

10. The pixel circuit according to claim 6, wherein the data writing circuitry comprises a data writing transistor, the driving circuitry comprises a driving transistor, the first energy storage circuitry comprises a first storage capacitor, and the second energy storage circuitry comprises a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; and a first end of the second storage capacitor is electrically coupled to the control electrode of the driving transistor, and a second end of the second storage capacitor is electrically coupled to the first voltage end.

11. The pixel circuit according to claim 1, wherein the data writing circuitry comprises a data writing transistor, the driving circuitry comprises a driving transistor, the first energy storage circuitry comprises a first storage capacitor, and the second energy storage circuitry comprises a second storage capacitor; a control electrode of the data writing transistor is electrically coupled to the gate line, a first electrode of the data writing transistor is electrically coupled to the data line, and a second electrode of the data writing transistor is electrically coupled to a first end of the first storage capacitor; a control electrode of the driving transistor is electrically coupled to a second end of the first storage capacitor, a first electrode of the driving transistor is electrically coupled to the first voltage end, and a second electrode of the driving transistor is the second end of the driving circuitry; and a first end of the second storage capacitor is electrically coupled to the control electrode of the driving transistor, and a second end of the second storage capacitor is electrically coupled to the first voltage end.

12. The pixel circuit according to claim 11, wherein the data writing transistor and the driving transistor are both low temperature polysilicon transistors.

13. A method for driving the pixel circuit according to claim 1, comprising:
  writing, by the data writing circuitry, a data voltage into the first end of the first energy storage circuitry under the control of a gate driving signal;
  enabling, by the compensation circuitry, the control end of the driving circuitry to be electrically coupled to the second end of the driving circuitry under the control of a compensation control signal; and
  generating, by the driving circuitry, a driving current for driving the light-emitting element under the control of a potential at the control end of the driving circuitry.

14. A display panel, comprising the pixel circuit according to claim 1.

15. A display device, comprising the display panel according to claim 14.

* * * * *